United States Patent
Väänänen

(10) Patent No.: US 7,148,760 B2
(45) Date of Patent: Dec. 12, 2006

(54) VCO GAIN TUNING USING VOLTAGE MEASUREMENTS AND FREQUENCY ITERATION

(75) Inventor: Paavo Väänänen, Nokia (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/026,560

(22) Filed: Dec. 30, 2004

(65) Prior Publication Data

US 2006/0145767 A1    Jul. 6, 2006

(51) Int. Cl.
*H03L 7/099* (2006.01)
(52) U.S. Cl. ............................ 331/25; 331/17; 331/179
(58) Field of Classification Search ................. 331/1 A, 331/10, 11, 14, 16–18, 25, 44, 179; 327/156–159; 329/325; 332/127; 360/51; 375/376; 455/260
See application file for complete search history.

(56) References Cited

U.S. PATENT DOCUMENTS

| | | | |
|---|---|---|---|
| 6,175,282 B1 * | 1/2001 | Yasuda | .......................... 331/44 |
| 6,233,441 B1 | 5/2001 | Welland | |
| 6,308,055 B1 | 10/2001 | Welland et al. | |
| 6,327,463 B1 | 12/2001 | Welland | |
| 6,388,536 B1 | 5/2002 | Welland | |
| 6,683,502 B1 * | 1/2004 | Groen et al. | ................... 331/17 |
| 2001/0020875 A1 | 9/2001 | Jansson | |
| 2002/0009984 A1 | 1/2002 | Welland et al. | |
| 2002/0034932 A1 | 3/2002 | Welland | |
| 2003/0042985 A1 | 3/2003 | Shibahara et al. | |
| 2003/0171105 A1 | 9/2003 | Dunworth et al. | |
| 2004/0087285 A1 | 5/2004 | Black et al. | |

FOREIGN PATENT DOCUMENTS

EP    1189351 A2    3/2002

\* cited by examiner

*Primary Examiner*—David Mis

(57) ABSTRACT

This invention describes a method for gain tuning of a voltage-controlled oscillator of a phase locked loop (PLL) of an electronic device using voltage measurements and a frequency iteration. The invention presents a method of minimizing integrated VCO gain variations. More specifically, the invention implementation is based on an analysis which includes changing the VCO frequency by iteration steps and optionally calculating said iteration steps and measuring a gain of said voltage controlled oscillator (VCO) at said frequencies changed by the iteration steps, wherein the analysis is based on a predetermined criterion. The present invention can be used in any radio architecture that requires limiting of the VCO gain variation and tuning its center frequency.

29 Claims, 2 Drawing Sheets

VCO GAIN TUNING USING VOLTAGE MEASUREMENTS AND FREQUENCY ITERATION

CROSS-REFERENCE TO RELATED APPLICATION

This application discloses subject matter which is also disclosed and which may be claimed in co-pending, co-owned applications U.S. application Ser. No. 11/027,563 filed on even date herewith.

TECHNICAL FIELD

This invention generally relates to calibration of electronic devices and more specifically gain tuning of a voltage-controlled oscillator using voltage measurements and a frequency iteration.

BACKGROUND ART

A phase locked loop (PLL) is traditionally used to generate a local oscillator (LO) signal in cellular and non-cellular radio transceivers. One of the key parts of the loop is a voltage controlled oscillator (VCO) generating an output signal which is the LO signal. Current silicon based integrated circuit manufacturing processes enable integrating of all the PLL blocks including the VCO to one chip if the process tolerances are taken into account during a design process. This requires calibrating the tolerances in the production line of the end product or at a suitable time when the device is turned on.

A traditional way to implement a transmitter on a radio application specific integrated circuit (ASIC) is to use a quadrature modulator to produce a radio frequency single sideband signal. A similar radio frequency signal can be also generated by using a so-called direct polar conversion. In these applications, a VCO control voltage is modulated to provide a signal phase modulation. An envelope modulation can be produced, for example, by modulating a power supply of a power amplifier. The polar conversion decreases an area of a transmitter on the ASIC and reduces a power dissipation with a proper design. On the other hand, it sets stringent requirements on individual transmitter block specifications, e.g., a PLL open loop gain variation. A VCO gain is an important parameter describing the open loop gain.

In a receiver, the PLL open loop gain may not be so precisely defined but the VCO just needs to be able to produce the right frequency in a certain tuning voltage range considered safe for the particular design. However, if the settling time of the PLL is needed to be optimized, the VCO gain optimization may be used in the receiver as well.

There are two aspects determining the design problem of integrated VCOs of which the first one is common to all receiver and transmitter architectures utilizing the integrated VCO and the second one is more related to the polar transmitter architecture.

First, the VCO center frequency varies due to the process and temperature variations so much that some coarse tuning of a resonator tank is needed to compensate the variations. The most popular way of doing so is to use a digitally controllable capacitor array in parallel with the resonator coil. Also resonator tuning, in series with the resonator coil or any other control type affecting the VCO center frequency, can be used.

Second, an accurate control of the PLL open loop gain requires controlling several parameters of the loop. One way of implementing the control is to make some measurements using analogue to digital conversions and then calculate calibration coefficients in a digital domain and convert them back to an analog parameter (e.g., a charge pump current) for the open loop gain tuning. The tuning is necessary to meet polar conversion requirements for all possible conditions over the frequency range, e.g., when at least a traditional PLL architecture containing a charge-pump, a passive loop filter and a varactor controlled VCO is utilized. It is well known that when less bits are needed for tuning, it reduces the converter design non-linearity problems arising from a device mismatch. The VCO gain variation range over the frequency band in use will affect requirements set to a DA (digital-to-analog) conversion compensating a VCO gain error effect on the VCO open loop gain.

There are several existing methods for coarse tuning a center frequency of the integrated VCO. However, none of the known prior art methods deal with a VCO gain variation at the same time.

DISCLOSURE OF THE INVENTION

The object of the present invention is to provide a methodology for gain tuning of a voltage-controlled oscillator of a phase locked loop (PLL) of an electronic device (e.g., a mobile phone) using voltage measurements and a frequency iteration.

According to a first aspect of the invention, a method for gain tuning of a voltage controlled oscillator (VCO) of a phase locked loop (PLL), comprises the steps of: providing a VCO output signal of the voltage controlled oscillator to a phase detector module of the phase locked loop (PLL), wherein a frequency of the VCO output signal is optionally divided by an adjustable number determined by a divider control signal thus generating a divided VCO output signal; providing a reference frequency signal containing a stable reference frequency corresponding to a frequency of the VCO output signal or optionally corresponding to the frequency divided by the adjustable number to the phase detector module; generating a PD error signal by a phase detector module in response to the VCO output signal or to the divided VCO output signal, further in response to the reference frequency signal and optionally in response to the divider control signal, wherein the PD error signal is a VCO tuning voltage signal or the VCO tuning voltage signal is generated by low-pass filtering of the PD error signal; generating a calibration signal and the divider control signal by a calibration control module in response to the VCO tuning voltage signal according to a predetermined criterion; and providing the VCO tuning voltage signal and the calibration signal to the voltage controlled oscillator for implementing the gain tuning of the VCO output signal of the voltage controlled oscillator (VCO) according to the predetermined criterion.

According further to the first aspect of the invention, the VCO tuning voltage signal and the calibration signal may be generated by analyzing, according to the predetermined criterion, the VCO output signal and optionally by analyzing, according to the predetermined criterion, a selected number of previous VCO output signals provided to the calibration control module at pre-selected past time periods, wherein the pre-selected number is an integer of at least a value of one. Further, the analysis based on the predetermined criterion may contain changing the frequency by iteration steps and optionally calculating the iteration steps, and measuring a gain of the voltage controlled oscillator (VCO) at the frequency changed by the iteration steps, and the analysis may be optionally performed by the calibration control module.

Further according to the first aspect of the invention, the low-pass filtering of the PD error signal may be performed by a low-pass filter.

Still further according to the first aspect of the invention, the divided VCO output signal may be generated by a divider in response to the VCO output signal and to the divider control signal, and a clock signal indicative of the divided frequency may be generated by the divider. Further, the VCO tuning voltage signal may be an analog format and converted to a digital format by an ADC block using the clock signal before the VCO tuning voltage signal is provided to the calibration control module.

According further to the first aspect of the invention, the VCO tuning voltage signal may be provided to a voltage controlled oscillator core of the voltage controlled oscillator and optionally the VCO tuning voltage signal may be an analog signal.

According still further to the first aspect of the invention, the calibration signal may be provided to a VCO calibration block of the voltage controlled oscillator, wherein optionally the calibration signal is a digital signal and the VCO calibration block may be a digitally controlled capacitor.

According further still to the first aspect of the invention, the voltage controlled oscillator (VCO) may be a part of an electronic communication device and may be used for transmitting or for receiving information in the electronic communication device. Still further, the electronic communication device may be a transmitter or a receiver, or both the transmitter and the receiver, or a portable communication device, or a mobile electronic device or a mobile phone. Further still, a user of the electronic communication device may program the calibration control module through a user interface for entering the predetermined criterion.

According still further to the first aspect of the invention, the phase detector module may contain a phase detector and optionally a charge pump.

According to a second aspect of the invention, a computer program product comprises: a computer readable storage structure embodying computer program code thereon for execution by a computer processor with the computer program code characterized in that it includes instructions for performing the steps of the first aspect of the invention.

According to a third aspect of the invention, an electronic device capable of gain tuning of a voltage controlled oscillator (VCO) of a phase locked loop (PLL) comprises: a voltage controlled oscillator, responsive to a VCO tuning voltage signal and to a calibration signal, for providing a VCO output signal, wherein optionally a frequency of the VCO output signal is divided by an adjustable number determined by a divider control signal, thus generating a divided VCO output signal; a reference frequency module, for providing a reference frequency signal containing a stable reference frequency corresponding to a frequency of the VCO output signal or optionally corresponding to the frequency divided by the adjustable number; a phase detector module, responsive to the reference frequency signal, responsive to the VCO output signal or the divided VCO output signal and optionally responsive to a divider control signal, for providing a PD error signal, wherein the PD error signal is the VCO tuning voltage signal or the VCO tuning voltage signal is generated by low-pass filtering of said PD error signal; and a calibration control module, responsive to the VCO tuning voltage signal, for providing the calibration signal and the divider control signal to the voltage controlled oscillator for implementing the gain tuning of the VCO output signal of the voltage controlled oscillator (VCO) according to the predetermined criterion.

According further to the third aspect of the invention, the VCO tuning voltage signal and the calibration signal may be generated by analyzing, according to the predetermined criterion, the VCO output signal and optionally by analyzing, according to the predetermined criterion, a selected number of previous VCO output signals provided to the calibration control module at pre-selected past time periods, wherein the pre-selected number is an integer of at least a value of one.

Still further, the analysis based on the predetermined criterion may contain changing the frequency by iteration steps and optionally calculating the iteration steps, and measuring a gain of the voltage controlled oscillator (VCO) at the frequency changed by the iteration steps, and the analysis may be optionally performed by the calibration control module.

Still further according to the third aspect of the invention, an electronic device may further comprise: a low-pass filter, responsive to the PD error signal, for providing the VCO tuning voltage signal by performing the low-pass filtering.

According still further to the third aspect of the invention, the electronic device may further comprise: a divider, responsive to the VCO output signal and to the divider control signal, for providing the divided VCO output signal and a clock signal indicative of the divided frequency may be generated by the divider. Still further, the VCO tuning voltage signal may be an analog format, and the electronic communication device may further comprise: an ADC block, for converting the VCO tuning voltage signal to a digital format using the clock signal before the VCO tuning voltage signal is provided to the calibration control module.

Still further according to the third aspect of the invention, the voltage controlled oscillator may comprise: a voltage controlled oscillator core, responsive to the VCO tuning voltage signal and optionally the VCO tuning voltage signal is an analog signal; and a VCO calibration block, responsive to the calibration signal and optionally the calibration signal is a digital signal and the VCO calibration block is a digitally controlled capacitor.

According further still to the third aspect of the invention, the voltage controlled oscillator (VCO) may be used for transmitting or for receiving information in the electronic device.

Further according to the third aspect of the invention, a user of the electronic device may program the calibration control module through a user interface for entering the predetermined criterion.

According still further to the third aspect of the invention, the electronic device may be a transmitter or a receiver, or both the transmitter and the receiver, or an electronic communication device, or a portable communication device, or a mobile electronic device or a mobile phone.

According to a fourth aspect of the invention, an integrated circuit capable of gain tuning of a voltage controlled oscillator (VCO) of a phase locked loop (PLL), comprises: a voltage controlled oscillator, responsive to a VCO tuning voltage signal and to a calibration signal, for providing a VCO output signal, wherein optionally a frequency of the VCO output signal is divided by an adjustable number determined by a divider control signal, thus generating a divided VCO output signal; a phase detector module, responsive to a reference frequency signal containing a stable reference frequency, responsive to the VCO output signal or the divided VCO output signal and optionally responsive to a divider control signal, for providing a PD error signal, wherein the PD error signal is the VCO tuning voltage signal or the VCO tuning voltage signal is generated by low-pass filtering of the PD error signal; and a calibration control module, responsive to the VCO tuning voltage signal, for providing the calibration signal and the divider control signal to the voltage controlled oscillator for implementing the gain tuning of the VCO output signal of the voltage controlled oscillator (VCO) according to the predetermined criterion.

According further to the fourth aspect of the invention, the VCO tuning voltage signal and the calibration signal may be generated by analyzing according to the predetermined criterion the VCO output signal and optionally by analyzing according to the predetermined criterion a selected number of previous VCO output signals provided to the calibration control module at pre-selected past time periods, wherein the pre-selected number is an integer of at least a value of one. Still further, the analysis based on the predetermined criterion may contain changing the frequency by iteration steps and optionally calculating the iteration steps, and measuring a gain of the voltage controlled oscillator (VCO) at the frequency changed by the iteration steps, and the analysis may be optionally performed by the calibration control module.

Still further, according to the fourth aspect of the invention, the integrated circuit may further comprise: a reference frequency module, for providing the reference frequency signal containing the stable reference frequency corresponding to a frequency of the VCO output signal or optionally corresponding to the frequency divided by the adjustable number.

Existing (prior art) VCO tuning algorithms do not provide an adequate control of a VCO gain, which is described by the present invention. Furthermore, a clear advantage of the present invention is that each decision at a switch point is based on the actual measurement of the VCO gain, which makes it tolerant to a quantization error of the VCO tuning words.

BRIEF DESCRIPTION OF THE DRAWINGS

For a better understanding of the nature and objects of the present invention, reference is made to the following detailed description taken in conjunction with the following drawings, in which.

BEST MODE FOR CARRYING OUT THE INVENTION

Figure 1:
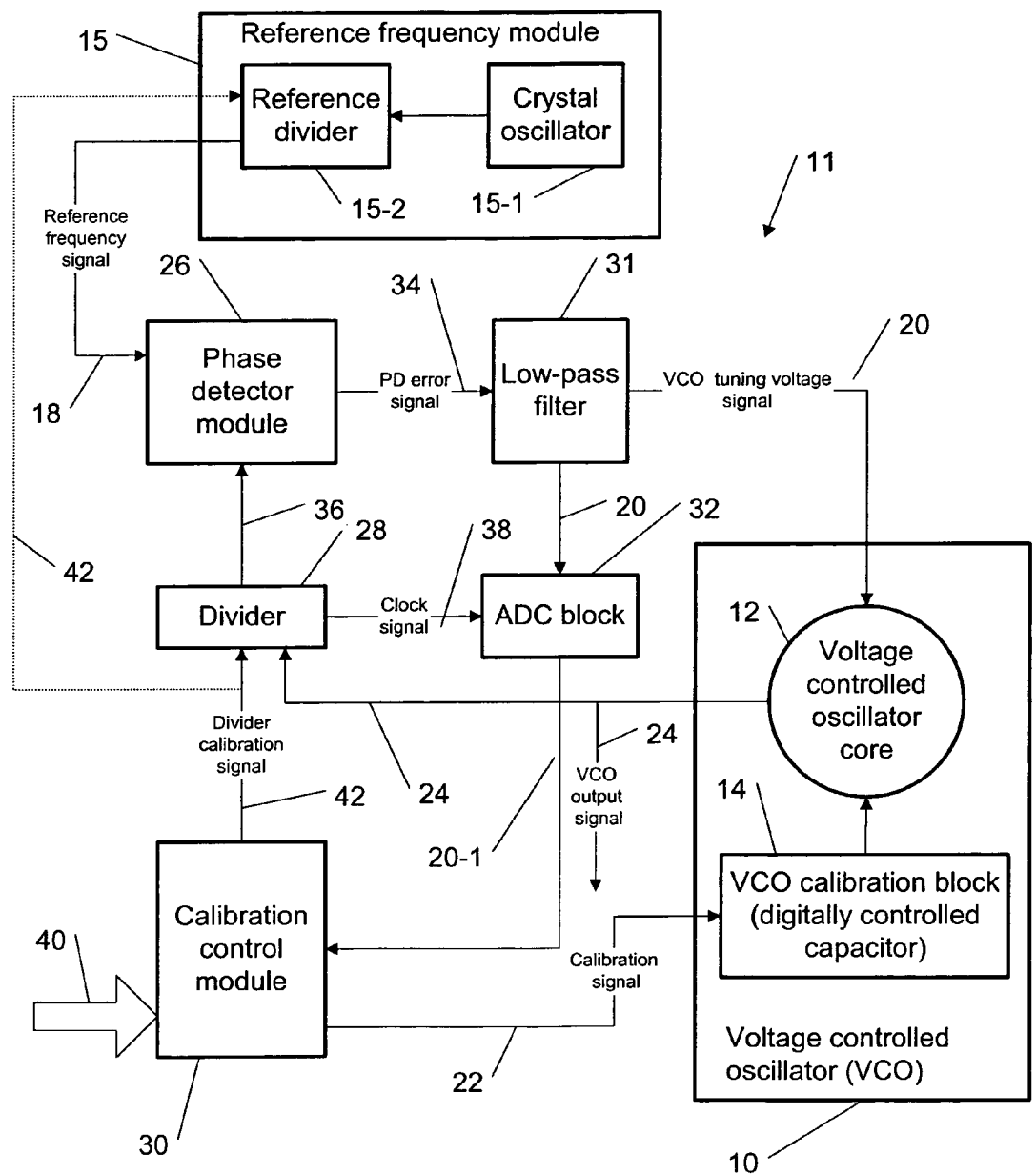
FIG. 1 is a block diagram demonstrating gain tuning of a voltage-controlled oscillator of a phase locked loop (PLL) using voltage measurements and a frequency iteration, according to the present invention.

The present invention provides a new methodology for gain tuning of a voltage-controlled oscillator of a phase locked loop (PLL) of an electronic device (e.g., electronic communication device, a portable communication device, a mobile electronic device, a mobile phone, etc.) using voltage measurements and a frequency iteration.

The present invention presents a method of minimizing integrated VCO gain variations. More specifically, the invention implementation is based on an analysis which includes changing the VCO frequency by iteration steps and optionally calculating said iteration steps and measuring a gain of said voltage controlled oscillator (VCO) at said frequencies changed by the iteration steps, wherein the analysis is based on a predetermined criterion. A more specific example is described below.

The present invention can be used in any radio architecture that requires limiting of the VCO gain variation and tuning its center frequency. The invention can be implemented with an on-chip logic (using, e.g., an application specific integrated circuit). The tuning can be implemented during a production by using software running an out-of-chip or on-chip controller. A "pure" on-chip hardware implementation is possible as well.

A voltage controlled oscillator 10 generates and provides a VCO output signal 24 which is used as a feedback signal by the phase locked loop (PLL) 11. In a preferred embodiment of the present invention, the VCO output signal 24 is provided to a divider 28 (in an alternative implementation there can be a plurality of dividers). The divider 28 divides the VCO output signal 24 in a frequency domain by an adjustable number determined by a divider control signal 42 (provided to the divider 11 or to both divider 11 and module 26 by a calibration control block 30 as described below) thus generating a divided VCO output signal 36 which is provided to the phase detector module 26. The divider 28 also generates a clock signal 38 indicative of the divided frequency generated by the divider 28. Alternatively, said clock signal 38 can be also provided by a reference frequency module 15. The reference frequency module 15 can contain a crystal oscillator 15-1 and optionally, a reference divider 15-2 and provides a reference frequency signal 18 containing a stable reference frequency corresponding to a frequency of the VCO output signal 24 or corresponding to said frequency divided by said adjustable number using the reference frequency divider (15-2).

In an alternative implementation, the divider 28 can divide the VCO output signal 24 in a frequency domain by a pre-selected number (as in a normal PLL system). Yet in another alternative implementation, the VCO output signal 24 can be directly provided to the phase detector module 26. A reference frequency signal 18 (having a stable frequency) is also provided to the phase detector module 26 by a reference frequency module 15 (e.g., as a buffered crystal oscillator), wherein said reference frequency signal 18 can be optionally divided by said adjustable number provided in the divider control signal 42.

The phase detector module 26 generates a PD error signal 34 in response to the divided VCO output signal 36 or the VCO output signal 24, further in response to said reference frequency signal 18. In a preferred embodiment of the present invention, the PD error signal 34 is filtered through a low-pass filter 31 to form a VCO tuning voltage signal 20 which is provided to the voltage controlled oscillator 10 (alternatively, the PD error signal 34 can be a VCO tuning voltage signal 20 if no low-pass filtering is required).

The VCO tuning voltage signal 20 is one of two tuning/calibration signals provided to the voltage controlled oscillator 10, according to the present invention. The second such signal, a calibration signal 22, is generated by a calibration control module 30. The calibration control module 30 generates the calibration signal 22 (typically in a digital format) and the divider control signal 42 in response to the VCO tuning voltage signal 20 according to a predetermined criterion. Typically, the VCO tuning voltage signal 20 is an analog format and it is converted to a digital format (signal 20-1) by an ADC block 32 using the clock signal 38

(provided by the divider 28) before said VCO tuning voltage signal 20 is provided to the calibration control module 30.

Thus, the VCO tuning voltage signal 20 and the calibration signal 22 are provided to said voltage controlled oscillator 10 for implementing said gain tuning of said VCO output signal 24 of said voltage controlled oscillator (VCO) 10 according to said predetermined criterion. Typically, the VCO tuning voltage signal 20 is an analog signal and the calibration signal 22 is a digital signal. The voltage controlled oscillator 10 comprises a voltage controlled oscillator core 12 responsive to said VCO tuning voltage signal 20 and a VCO calibration block 14 (e.g., a digitally controlled capacitor) responsive to the calibration signal 22.

According to the present invention, during a calibration (tuning) process (as described below in detail regarding an example of FIG. 2), the VCO tuning voltage signal 20 and the calibration signal 22 are generated using said predetermined criterion by analyzing said VCO output signal 24 and optionally by analyzing a selected number of previous VCO output signals 24 provided to the calibration control module 30 at pre-selected past time periods, wherein said pre-selected number is an integer of at least a value of one.

Moreover, according to the present invention, said analysis based on said predetermined criterion contains changing said frequency by iteration steps and calculating the iteration steps, and measuring a gain of said voltage controlled oscillator (VCO) at frequencies set by said iteration steps wherein said analysis is performed by the calibration control module 30. An example of the calibration (tuning) procedure using the analysis described above, using the predetermined criterion is described in detail below regarding FIG. 2.

It is noted, that the voltage controlled oscillator (VCO) 10 can be a part of an electronic device or an electronic communication device and can be used for transmitting or for receiving information in said electronic communication device. In other words said electronic communication device can be a transmitter, a receiver or both the transmitter and the receiver.

According to the present invention, the calibration control module 30 performs the analysis described above according to the predetermined criterion. A user of the electronic communication device containing said PLL 11 can program the calibration control module 30 through a user interface 40 for entering and implementing said predetermined criterion. The calibration control module 30 can consist of software that is running on processor outside or inside of a chip (e.g., an application specific integrated circuit) containing the VCO 10 and PLL 11. The calibration control module 30 can be also implemented wholly with an on-chip CMOS logic or it can be a combination of the software and the on-chip logic.

Figure 2:
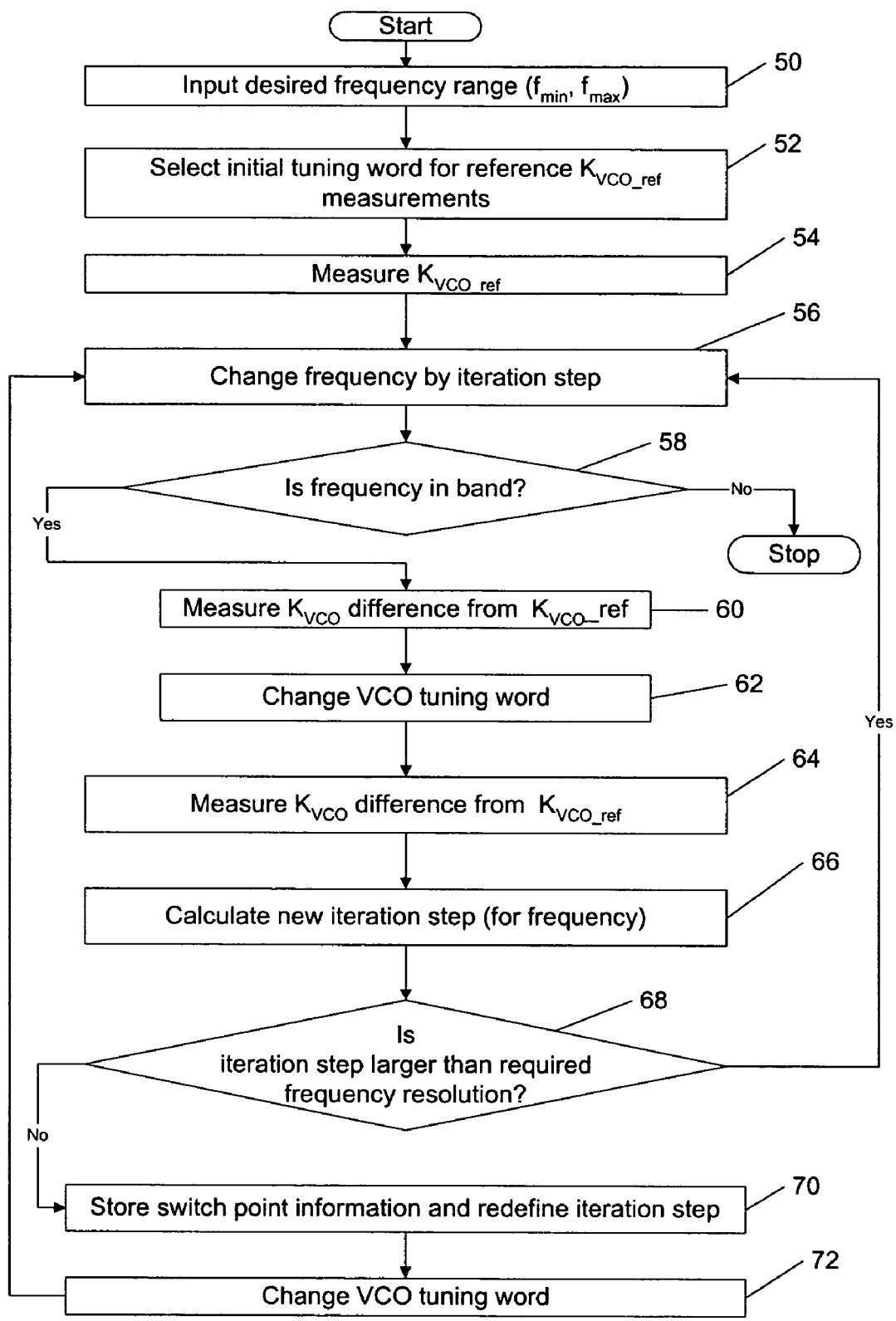
FIG. 2 is a flow diagram demonstrating a calibration procedure for the phase locked loop of FIG. 1, according to the present invention.

FIG. 2 shows a flow diagram demonstrating a calibration procedure for the phase locked loop 11 of FIG. 1, according to the present invention. Here a VCO gain variation limiting function is based on measurements of a tuning voltage difference versus predefined frequency offset on consecutive VCO tuning words contained in calibration signal 22. Optimum switch frequencies and voltages are stored so that the optimum VCO tuning word can be set when the channel is changed or the tuning voltage (contained in the VCO tuning voltage signal 20) roams, e.g., due to a temperature change. Details are provided below.

The flow chart of FIG. 2 only represents one possible scenario among many others. In a method according to the present invention, in a first step 50, a desired VCO tuning frequency range, e.g., defined by maximum ($f_{max}$) and minimum ($f_{min}$) frequencies is set, for example, through the user interface 40. In a next step 52, the VCO tuning word for measuring a reference gain $K_{VCO\_ref}$ is selected using a coarse tuning before actual optimization. The criterion and algorithm for the first VCO tuning word selection can vary and depend on a number of the tuning words of the VCO and other system level parameters of the particular design and application. The first VCO tuning word is chosen (e.g., again through the user interface 40) and provided by the calibration control module 30 using the calibration signal 22 to facilitate a good model for the VCO's frequency vs. the VCO tuning word characteristics. For example, if a frequency of interest is 1815 MHz and it is known beforehand that a 6-bit VCO will produce that frequency of 1815 MHz in a range of the VCO tuning words from 34 to 44, then it can be best to configure the first VCO tuning word of 38 (i.e., a mid channel of the band under calibration).

In a next step 54, the reference gain $K_{VCO\_ref}$ is measured using, e.g., the following procedure: a) setting a PLL frequency (using signals 42 and 20) and measure a corresponding voltage $V_{vco1}$; b) setting another PLL frequency (using signals 42 and 20) and measure a corresponding voltage $V_{vco2}$; and c) calculating $K_{VCO\_ref}$ as a slope of a PLL frequency versus a VCO voltage curve (e.g., measured as a frequency change versus a voltage change provided by the signal 20-1 from the ADC block 32). The reference gain $K_{VCO\_ref}$ is further used as a reference for optimizing the $K_{VCO}$ variation over the frequency band of interest. Alternatively, a user determined $K_{VCO}$ target value can be used as a reference.

In a next step 56, the VCO frequency is changed by an iteration step (using the block 30) by providing the divider control signal 42 (as described above). The initial iteration step is a predetermined parameter (e.g., provided through the user interface 40), which depends on the VCO design and the frequency range of interest.

In a next step 58, it is determined whether the iterated frequency (after the iteration step) is still in the desired VCO tuning frequency range (i.e., between $f_{min}$ and $f_{max}$). If that is not the case, the calibration procedure is stopped. However, if it is determined that the iterated frequency is still in the desired VCO tuning frequency range, in a next step 60, a new VCO gain $K_{VCO}$ is measured (as described above) in reference to $K_{VCO\_ref}$ In a next step 62, the VCO tuning word is changed (e.g., by the calibration control module 30). The rationale for step 62 is to measure the $K_{VCO}$ at the frequency that has been set and then change the VCO tuning word higher or lower depending on which way the frequencies are scanned (and which way the VCO tuning words affect the frequency). In a next step 64, the VCO gain $K_{VCO}$ is measured again in reference to $K_{VCO\_ref}$ and their difference, $K_{VCO\_error}$, indicates what is the sign of the next frequency iteration step and the measured $K_{VCO}$ values are used for calculating the next candidate for an ideal switch frequency for the two tuning words under calibration.

In a next step 66, a new frequency iteration step is calculated (again by the calibration control module 30). The rationale for step 66 is to avoid scanning all the channels in the desired VCO tuning frequency range (i.e., between $f_{min}$ and $f_{max}$) by changing the iteration step (frequency change) between the steps of the calibration procedure. Algorithm starts with a large iteration step and the step is decreased until it reaches the desired (wanted) accuracy. This new iteration step can be calculated, e.g., based on the previous $K_{VCO}$ measurements.

In a next step 68, it is determined whether the new iteration frequency step is larger than a required frequency resolution (e.g., the required resolution can depend on defined channel spacing of a communication protocol air interface). If it is determined that this is the case, the process goes back to step 56. However, if is determined that the new iteration frequency step is not larger than a required frequency resolution, in a next step 70, a switch point information is stored and the frequency iteration step is redefined (e.g., a new, larger iteration step needs to be defined based on previous measurements). Step 70 typically implies storing the VCO tuning word, a frequency (or a channel number) of the found switching point and a control voltage (e.g., the output signal 20-1 from the ADC block 32). The control voltage information can be used later to track and compensate the temperature roaming. Finally, in a next step 72, the VCO tuning word is changed again to prepare for a next round of optimization and the process goes back to step 56. The VCO tuning word is changed based on the direction of VCO calibration word scanning: it may be upwards or downwards or start from middle and first scan upwards and then downwards.

It is to be understood that the above-described arrangements are only illustrative of the application of the principles of the present invention. Numerous modifications and alternative arrangements may be devised by those skilled in the art without departing from the scope of the present invention, and the appended claims are intended to cover such modifications and arrangements.

What is claimed is:

1. A method comprising:
providing a VCO output signal of a voltage controlled oscillator to a phase detector module of a phase locked loop PLL, wherein a frequency of said VCO output signal is divided by an adjustable number determined by a divider control signal thus generating a divided VCO output signal, said adjustable number being equal to or larger than one;
providing a reference frequency signal comprising a stable reference frequency corresponding to said frequency divided by said adjustable number to said phase detector module;
generating a PD error signal by a phase detector module in response to said divided VCO output signal, further in response to said reference frequency signal and in response to said divider control signal, wherein a VCO tuning voltage signal is one of: a) said PD error signal, and b) said PD error signal filtered by a low-pass filter;
generating a calibration signal and said divider control signal by a calibration control module in response to said VCO tuning voltage signal according to a predetermined criterion; and
providing said VCO tuning voltage signal and said calibration signal to said voltage controlled oscillator for implementing gain tuning of said VCO output signal of said voltage controlled oscillator according to said predetermined criterion.

2. The method of claim 1, wherein said VCO tuning voltage signal and said calibration signal are generated by analyzing, according to said predetermined criterion, at least one of:
a) said VCO output signal and
b) a selected number of previous VCO output signals provided to said calibration control module at pre-selected past time periods, wherein said pre-selected number is an integer of at least a value of one.

3. The method of claim 2, wherein said analysis performed using said predetermined criterion comprises at least one of:
a) changing said frequency by iteration steps,
b) calculating said iteration steps, and
c) measuring a gain of said voltage controlled oscillator at said frequency changed by said iteration steps.

4. The method of claim 1, wherein said low-pass filtering of said PD error signal is performed by a low-pass filter.

5. The method of claim 1, wherein said divided VCO output signal is generated by a divider in response to said VCO output signal and to said divider control signal, and a clock signal indicative of said divided frequency is generated by said divider.

6. The method of claim 5, wherein said VCO tuning voltage signal is an analog format and converted to a digital format by an ADC block using said clock signal before said VCO tuning voltage signal is provided to said calibration control module.

7. The method of claim 1, wherein said VCO tuning voltage signal is provided to a voltage controlled oscillator core of said voltage controlled oscillator and said VCO tuning voltage signal is an analog signal.

8. The method of claim 1, wherein said calibration signal is provided to a VCO calibration block of said voltage controlled oscillator, wherein said calibration signal is a digital signal and said VCO calibration block is a digitally controlled capacitor.

9. The method of claim 1, wherein said voltage controlled oscillator VCO is a part of an electronic communication device and used for transmitting or for receiving information in said electronic communication device.

10. The method of claim 9, wherein said electronic communication device is a transmitter or a receiver, or both said transmitter and said receiver, or a portable communication device, or a mobile electronic device or a mobile phone.

11. The method of claim 9, wherein a user of said electronic communication device programs said calibration control module through a user interface for entering said predetermined criterion.

12. The method of claim 1, wherein said phase detector module contains a phase detector and a charge pump.

13. A computer program product comprising: a computer readable storage structure embodying computer program code thereon for execution by a computer processor, wherein said computer program code comprises instructions for performing a method according to claim 1.

14. An electronic device comprising:
a voltage controlled oscillator, responsive to a VCO tuning voltage signal and to a calibration signal, configured to provide a VCO output signal, wherein a frequency of said VCO output signal is divided by an adjustable number determined by a divider control signal, thus generating a divided VCO output signal, said adjustable number being equal to or larger than one;
a reference frequency module, configured to provide a reference frequency signal comprising a stable reference frequency corresponding to said frequency divided by said adjustable number;
a phase detector module, responsive to said reference frequency signal, responsive to said said divided VCO output signal and responsive to a divider control signal, configured to provide a PD error signal, wherein a VCO tuning voltage signal is one of: a) said PD error signal, and b) said PD error signal filtered by a low-pass filter; and
a calibration control module, responsive to said VCO tuning voltage signal, configured to provide said calibration signal and said divider control signal to said voltage controlled oscillator for implementing gain tuning of said VCO output signal of said voltage controlled oscillator according to said predetermined criterion.

15. The electronic device of claim 14, wherein the calibration control module is configured generate said VCO tuning voltage signal and said calibration signal by analyzing, according to said predetermined criterion, said VCO output signal and by analyzing, according to said predetermined criterion, at least one of:
   a) said VCO output signal and
   b) a selected number of previous VCO output signals provided to said calibration control module at pre-selected past time periods, wherein said pre-selected number is an integer of at least a value of one.

16. The electronic device of claim 15, wherein said analysis performed using said predetermined criterion comprises at least one of:
   a) changing said frequency by iteration steps,
   b) calculating said iteration steps, and
   c) measuring, a gain of said voltage controlled oscillator VCO at said frequency changed by said iteration steps.

17. The electronic device of claim 14, further comprising:
   a low-pass filter, responsive to said PD error signal, configured to provide said VCO tuning voltage signal by performing said low-pass filtering.

18. The electronic device of claim 14, further comprising:
   a divider, responsive to said VCO output signal and to said divider control signal, configured to provide said divided VCO output signal and a clock signal indicative of said divided frequency is generated by said divider.

19. The electronic device of claim 18, wherein said VCO tuning voltage signal is an analog format, and said electronic communication device further comprises:
   an ADC block, configured to convert said VCO tuning voltage signal to a digital format using said clock signal before said VCO tuning voltage signal is provided to said calibration control module.

20. The electronic device of claim 14, wherein said voltage controlled oscillator comprises at least one of:
   a) a voltage controlled oscillator core, responsive to said VCO tuning voltage signal and said VCO tuning voltage signal is an analog signal; and
   b) a VCO calibration block, responsive to said calibration signal and said calibration signal is a digital signal and said VCO calibration block is a digitally controlled capacitor.

21. The electronic device of claim 14, wherein said voltage controlled oscillator is configured to transmit or receive information in said electronic device.

22. The electronic device of claim 14, wherein said calibration control module is configured to be programmed through a user interface for entering said predetermined criterion.

23. The electronic device of claim 14, wherein said electronic device is a transmitter or a receiver, or both said transmitter and said receiver, or an electronic communication device, or a portable communication device, or a mobile electronic device or a mobile phone.

24. An integrated circuit comprising:
   a voltage controlled oscillator, responsive to a VCO tuning voltage signal and to a calibration signal, configured to provide a VCO output signal, wherein a frequency of said VCO output signal is divided by an adjustable number determined by a divider control signal, thus generating a divided VCO output signal, said adjustable number being equal to or larger than one;
   a reference frequency module, configured to provide a reference frequency signal comprising a stable reference frequency corresponding to a said frequency divided by said adjustable number;
   a phase detector module, responsive to said reference frequency signal, responsive to said said divided VCO output signal and responsive to a divider control signal, configured to provide a PD error signal, wherein a VCO tuning voltage signal is one of: a) said PD error signal, and b) said PD error signal filtered by a low-pass filter; and
   a calibration control module, responsive to said VCO tuning voltage signal, configured to provide said calibration signal and said divider control signal to said voltage controlled oscillator for implementing gain tuning of said VCO output signal of said voltage controlled oscillator according to said predetermined criterion.

25. The integrated circuit of claim 24, wherein the calibration control module is configured generate said VCO tuning voltage signal and said calibration signal by analyzing, according to said predetermined criterion, said VCO output signal and by analyzing, according to said predetermined criterion, at least one of:
   a) said VCO output signal and
   b) a selected number of previous VCO output signals provided to said calibration control module at pre-selected past time periods, wherein said pre-selected number is an integer of at least a value of one.

26. The integrated circuit of claim 25, wherein said analysis performed using said predetermined criterion comprises at least one of:
   a) changing said frequency by iteration steps,
   b) calculating said iteration steps, and
   c) measuring a gain of said voltage controlled oscillator VCO at said frequency changed by said iteration steps.

27. The integrated circuit of claim 24, further comprising:
   a reference frequency module, configured to provide said reference frequency signal comprising said stable reference frequency corresponding to said frequency divided by said adjustable number.

28. An apparatus, comprising:
   means for providing a VCO output signal, wherein a frequency of said VCO output signal is divided by an adjustable number determined by a divider control signal thus generating a divided VCO output signal, said adjustable number being equal to or larger than one;
   means for providing a reference frequency signal comprising a stable reference frequency corresponding to said frequency divided by said adjustable number to said phase detector module;
   means for generating a PD error signal in response to said divided VCO output signal, further in response to said reference frequency signal and in response to said divider control signal, wherein a VCO tuning voltage signal is one of: a) said PD error signal, and b) said PD error signal filtered by a low-pass filter;
   means for generating a calibration signal and said divider control signal in response to said VCO tuning voltage signal according to a predetermined criterion, and for providing said VCO tuning voltage signal and said calibration signal to said means for providing the VCO output signal for implementing gain tuning of said VCO output signal according to said predetermined criterion.

29. The apparatus of claim 28, wherein said apparatus is an electronic device configured for gain tuning in a phase locked loop.

* * * * *

UNITED STATES PATENT AND TRADEMARK OFFICE
CERTIFICATE OF CORRECTION

PATENT NO. : 7,148,760 B2
APPLICATION NO. : 11/026560
DATED : December 12, 2006
INVENTOR(S) : Paavo Vaananen It is certified that error appears in the above-identified patent and that said Letters Patent is hereby corrected as shown below:

In column 10, line 58, claim 14, line 15, second "said" should be deleted. Also wrong in amendment.

In column 12, line 9, claim 24, line 15, second "said" should be deleted. Also wrong in amendment.

Signed and Sealed this

Eighth Day of May, 2007

JON W. DUDAS
*Director of the United States Patent and Trademark Office*